United States Patent
Wang et al.

(10) Patent No.: US 6,787,475 B2
(45) Date of Patent: Sep. 7, 2004

(54) FLASH STEP PREPARATORY TO DIELECTRIC ETCH

(76) Inventors: Zhuxu Wang, 19327 Sakura Way, Cupertino, CA (US) 95014; Jingbao Liu, 760 Holbrook Pl., Sunnyvale, CA (US) 94087; Claes H. Bjorkman, 1532 California St., #5, Mountain View, CA (US) 94041; Bryan Pu, 3064 Rosato Ct., San Jose, CA (US) 95135

(*) Notice: Subject to any disclaimer, the term of this patent is extended or adjusted under 35 U.S.C. 154(b) by 0 days.

(21) Appl. No.: 10/163,812

(22) Filed: Jun. 5, 2002

(65) Prior Publication Data

US 2003/0045116 A1 Mar. 6, 2003

Related U.S. Application Data

(60) Provisional application No. 60/317,848, filed on Sep. 6, 2001.

(51) Int. Cl.[7] .............................................. H01L 21/302
(52) U.S. Cl. ...................... 438/710; 438/712; 438/714; 438/717; 438/723; 438/724
(58) Field of Search ................................ 438/710, 712, 438/714, 717, 723, 724

(56) References Cited

U.S. PATENT DOCUMENTS

| | | | | |
|---|---|---|---|---|
| 5,338,399 A | | 8/1994 | Yanagida ..................... 156/662 |
| 6,057,247 A | | 5/2000 | Imai et al. ................... 438/714 |
| 6,159,862 A | | 12/2000 | Yamada et al. ............. 438/712 |
| 6,171,962 B1 | * | 1/2001 | Karlsson et al. ............ 438/692 |
| 6,174,451 B1 | | 1/2001 | Hung et al. .................... 216/67 |
| 6,326,307 B1 | * | 12/2001 | Lindley et al. .............. 438/689 |
| 6,403,491 B1 | | 6/2002 | Liu et al. ..................... 438/710 |
| 6,451,703 B1 | * | 9/2002 | Liu et al. ..................... 438/710 |
| 2002/0039843 A1 | | 4/2002 | Ikeda et al. ................. 438/738 |
| 2003/0003714 A1 | | 1/2003 | Lee et al. .................... 438/636 |

FOREIGN PATENT DOCUMENTS

| | | |
|---|---|---|
| WO | WO 00/59021 | 10/2000 |
| WO | WO 01/68939 | 9/2001 |
| WO | WO 01/86701 | 11/2001 |

OTHER PUBLICATIONS

International Patent Search.

* cited by examiner

*Primary Examiner*—Nadine G. Norton
*Assistant Examiner*—Binh X. Tran
(74) *Attorney, Agent, or Firm*—Charles S. Guenzer; Joseph Bach

(57) ABSTRACT

A dielectric plasma etch method particularly useful for assuring that residue does not form in large open pad areas used for monitoring etching of narrow via and contact holes. The main dielectric etch of the via and contact holes uses a highly polymerizing chemistry, preferably of a low-F/C fluorocarbon such as $C_4F_6$ in conjunction with $O_2$ and Ar. A short flash step precedes the main plasma etch using a plasma of a gas less polymerizing than the gas of the main etch, and the plasma is not extinguished between the flash and main steps. The flash step may be used to remove an anti-reflection coating (ARC) covering the dielectric layer and use a lean fluorocarbon, such as $CF_4$, perhaps together with $O_2$ and Ar. In the absence of ARC, an argon flash may be used.

34 Claims, 3 Drawing Sheets

FLASH STEP PREPARATORY TO DIELECTRIC ETCH

RELATED APPLICATION

This application claims benefit of U.S. Provisional Application No. 60/317,848, filed Sep. 6, 2001.

BACKGROUND OF THE INVENTION

1. Field of the Invention

The invention relates generally to plasma etching in integrated circuit fabrication. In particular, the invention relates to a cleaning step performed prior to a dielectric etch step.

2. Background Art

Modern integrated circuits contain many levels of metallization, each including a dielectric layer separating one level of horizontal wiring from another. As illustrated in the cross-sectional view of FIG. 1, a lower layer 10 includes conductive features 12 at its surface needing to be electrically contacted from above. The lower layer 10 may be a dielectric layer in which the conductive features 12 are metal features, or it may be the silicon substrate in which the conductive features are doped regions of the silicon forming part of an active device. In order to increase the number of active devices and allow for complex wiring, the conductive features 12 have small lateral size and are packed closely together. An inter-level dielectric layer 14 is deposited on the lower layer 10. The dielectric layer 14 is typically formed of a silicon oxide deposited in a plasma CVD process using TEOS as a precursor, but more advanced dielectrics with low dielectric constants are being developed. The inter-level dielectric layer 14 typically has a thickness of about 1 $\mu$m. The photolithography required for etching the contact and via holes through the dielectric often requires that the dielectric layer 14 be covered by a thin anti-reflective coating 16, commonly referred to as ARC. It maybe composed of BARC, a silicon-containing organic material, and have a thickness of 50 to 80 nm. However, inorganic ARCs, for example, of silicon nitride, are also well known. A photoresist layer 18 is deposited over the anti-reflective coating 16 and is photographically patterned to form mask holes 20,22. The smaller mask holes 20 correspond to the width and location of to via or contact holes to be etched in the dielectric layer 14 to contact the conductive features 12. The anti-reflective coating 16 has a thickness and refractive index that are selected to minimize extraneous scattering of the patterning light, which would degrade the resolution of the photolithography of the smaller mask holes 20. This description of the dielectric layer 14 is overly simplified. It may further include an etch stop layer at its bottom, and in complex interconnect schemes like dual damascene another etch stop layer vertically separates two parts of the dielectric.

After the photomask has been defined, the wafer is placed into a plasma etch reactor to etch contact or via holes 24, illustrated in the cross-sectional view of FIG. 2, through openings in the anti-reflective layer 16 and the dielectric layer 14 to expose the underlying conductive features 12. Either a contact hole or a via hole may be referred to as a plug hole. The contact or via holes 20 are then filled with a metal, such as aluminum, copper, or tungsten, to provide a vertical electrical connection through the dielectric layer 14 to contact the lower conductive features 12 to a horizontal electrical arrangement defined above the dielectric layer 14. This process may be repeated five times or more for advanced integrated circuits having multiple levels of metallization.

For advanced devices, the contact or via holes 24 are typically rectangular or square having a minimum width for advanced devices of 0.25 $\mu$m or smaller and requiring a highly anisotropic etch to produce holes having a high-aspect ratio.

The larger mask hole 22 in the photoresist layer 18 defines through the dielectric layer 14 one or more open pads 26. The larger mask hole 22 is etched at the same time as the contact or via holes 24, according to the same etching process. The open pad 26, which can alternatively be called a monitoring area, is also typically rectangular or square and has significantly larger lateral dimensions than do the contact or via holes 20, by, for example, a factor of at least 50. A lateral dimension of 20 $\mu$m is typical. The open pad 26 is usually located in an area of the chip or wafer not associated with the active devices and does not form a functional part of the integrated circuit being fabricated. It is called an open pad because it resembles a pad used for electrically contacting a bonding wire or other external electrical contact to the integrated circuit, but an open pad is never used as a contact. Indeed, open pads are typically formed in each level of metallization to monitor deposition and etching conditions for each level.

Because of its large size, the open pad 26 is more easily imaged than the very small contact and via holes. For example, etch rate and residues can be optically imaged in the open pad 26 while corresponding measurements in the narrow contact and via holes 24 typically require destructive sectioning of the wafer and time consuming electron microscopy. While open pads are particularly useful in developmental work, they also are frequently used in a production environment to assure that the standardized etch rates are being maintained.

Microloading effects are well known in which the aspect ratio of holes being etched and even the density of high aspect-ratio holes influence the etching rate. While microloading complicates the correspondence between etching rates of the narrow contact and via holes and of the much wider open pads, as long as the differences are small and fixed, a usable correlation can be obtained by applying empirically obtained proportionality factors.

Etching of the closely spaced, high aspect-ratio contact and via holes in the oxide dielectric requires an anisotropic etch. Further, the oxide etch should be highly selective to both photoresist and to silicon nitride etch stop layers defining the end of the etching profile. Such requirements have necessitated refinements in etching processes and plasma reactors. A particularly successful oxide chemistry is based on hexafluorobutadiene ($C_4F_6$), a hydrogen-free fluorocarbon that has a low F/C ratio of 1.5. Octafluorocyclopentene ($C_5F_8$) has a somewhat higher F/C ratio of 1.6 but still offers many of the same advantages. Octafluorocyclobutane ($C_4F_8$) is commonly used in the industry, but its F/C ratio of 2.0 is disadvantageously high for etching vias with very high aspect ratios. During a plasma etch performed under the correct conditions, the fluorocarbon forms a protective polymer on the vertical sidewalls and on bottom non-oxide surfaces of the hole being etched. Thereby, the etch can form vertical sidewalls and be selective to underlying silicon or silicon nitride.

In U.S. patent application Ser. No. 09/522,374, filed Mar. 10, 2000, now issued as U.S. Pat. No. 6,451,703, and incorporated herein by reference in its entirety, Liu et al. describe plasma oxide etch of oxide performed in the magnetically enhanced reactive ion etch (MERIB) reactor 30 schematically illustrated in FIG. 3. Such a reactor is the eMax reactor commercially available from Applied Materials of Santa Clara, California. It includes a grounded vacuum chamber 32, perhaps including liners to protect the walls. A wafer 34 is inserted into the chamber 32 through a slit valve opening 36 and placed on a cathode pedestal 38 with an electrostatic chuck 40 selectively clamping the wafer. The chuck powering is not illustrated. Unillustrated fluid cooling channels through the pedestal 38 maintain the pedestal at reduced temperatures. A thermal transfer gas such as helium is supplied to unillustrated grooves in the upper surface of the pedestal 38 facing the back side of the wafer 34. The thermal transfer gas increases the efficiency of thermal coupling between the temperature controlled pedestal 38 and the wafer 34, which is held against the pedestal 38 by the electrostatic chuck 40 or an alternatively used peripheral wafer clamp.

An RF power supply 42, preferably operating at 13.56 MHz, is connected to the cathode pedestal 38 and provides the only significant power for generating the plasma while it also controls the DC self-bias. Electromagnetic coils 44 positioned at the four sides of the chamber and powered by unillustrated current supplies generate a slowly rotating (on the order of no more than a few seconds and typically somewhat less than 10 ms), horizontal, essentially DC magnetic field in order to increase the density of the plasma. A vacuum pump system 46 pumps the chamber 32 through an adjustable throttle valve 48. Shields 50, 52 not only protect the chamber 32 and pedestal 38 but also define a baffle 54 and a pumping manifold 56 connected to the throttle valve 48.

Processing gases are supplied from gas sources 58, 60, 62, 64 through respective mass flow controllers 66, 68, 70, 72 to a quartz gas distribution plate 74 positioned in the roof of the chamber 32 overlying the wafer 34 and separated from it across a processing region 76. The distribution plate 74 includes a inlet manifold 78 receiving the processing gas and communicating with the processing region 76 through a showerhead having a large number of distributed apertures 80 so as to inject a more uniform flow of processing gas into the processing region 76.

Liu et al. are concerned primarily with the difficult task of etching high aspect-ratio via holes with high selectivity to photoresist and silicon nitride. They accomplish the via etch with an etching gas comprising $C_4F_6$, oxygen gas ($O_2$), and a large amount of argon (Ar). The oxygen is used to reduce the amount of polymer produced by $C_4F_6$ during the plasma etch. Excessive polymerization causes the sidewall plasma to bridge the developing hole and to prevent further etching of the hole. This deleterious effect is called etch stop.

Liu et al. do not address the BARC open step of removing the thin anti-reflection coating. However, the BARC open, if required, is easily accomplished with a short etch of carbon tetrafluoride ($CF_4$), preferably with no magnetic field. This step is often referred to as the flash step because of its brevity, typically no more than 10 s. Little anisotropy is needed, and no polymer is required in the flash step.

It has been conventional practice to separate the flash step from the main etch by a distinct transition step. After the BARC layer has been opened, the RF power is turned off, thereby extinguishing the plasma, and the supply of $CF_4$ is cut off. Then, the main etch gases of $C_4F_6$, $O_2$, and Ar are supplied into the chamber and allowed to equilibrate for about 10 s in achieving the desired pressure. Thereafter in the conventional process, the RF power is turned back on to again excite the plasma and perform the main oxide etch. Typically, it requires about 3 to 5 s to turn on the RF power and reignite the plasma, and another 10 s may be required to equilibrate the chamber if there is a change in pressure or gas composition.

Although such a process has been highly effective in etching the narrow via holes, it has been observed to deleteriously affect the open pads. In particular, as illustrated in the structure of FIG. 4, following the BARC open, a residue 84 tends to form on the oxide 16 at the bottom of the developing open pad. Under severe conditions, the residue 84 prevents further etching and a shallow open pad 86 is formed at the end of etching even though the via holes 24 are completely etched through the oxide layer 14. That is, the dielectric 12 is not etched through in the area of the open pad in a process similar to etch stop. Nonetheless, the narrow contact and via holes 22 are successfully etched. Any etch rates measured with residue forming in the open pad area are nearly useless in correlating etch rates for the via and etch holes 22 from the observed depth of the shallow open pad 86.

SUMMARY OF THE INVENTION

In a dielectric plasma etching process, a flash step precedes a main etch step, and the plasma is not extinguished between the flash and main etch steps. The main etch step may be performed using an etching gas including a perfluorocarbon with a low F/C ratio of 1.6 or less, for example, $C_4F_6$. The flash step uses a process gas that is less polymerizing than the etching gas. It may be substantially composed of fluorocarbon such as $CF_4$ or of Ar. Other fluorocarbons less polymerizing than the main etchant may be used for the flash step, for example, $C_4F_8$ or other perfluorocarbons with an F/C ratio of at least 2.0.

If the dielectric is covered with an anti-reflection coating, the flash step may be used to etch through the anti-reflection coating, for example, with a fluorocarbon etch chemistry.

In another embodiment, a combination of the perfluorocarbon, oxygen, and argon are used in both steps but the ratio of oxygen to perfluorocarbon is higher in the flash than in the main etch step.

The transition from flash to main etch may be shortened by maintaining a same pressure in the etch chamber during the two steps. In a magnetically enhanced plasma reactor with a variable magnetic field, the magnetic field may be turned on only after the transition to the main etch conditions have been achieved, or alternatively increased from a lower value.

The invention is particularly useful for avoiding residue in large open pad areas used for monitoring the process of etching small, high aspect-ratios vias and contact holes. A power-on transition is one of several methods available to maintain a higher temperature in the transition to thereby prevent the residue from depositing.

DETAILED DESCRIPTION OF THE PREFERRED EMBODIMENTS

Hexafluorobutadiene ($C_4F_6$) is a fluorine-based etching gas that may be used for etching narrow, high-aspect ratio holes in oxides. It is a perfluorocarbon, that is, free of hydrogen and a fully fluorine-substituted fluorocarbon, and has a lower F/C ratio than two other commonly used perfluorocarbons, octafluorocyclobutane ($C_4F_8$) and octafluorocyclopentene ($C_5F_8$) although $C_5F_8$ has found widespread use because its F/C ratio is almost as low. As a result, $C_4F_6$ tends to abundantly form polymer, which is crucial in the selective anisotropic oxide etch required for advanced circuits. However, excessive polymerization must be avoided lest etch stop occurs in the via holes. Wafer temperature is one of the tools together with pressure and bias power used to control the degree of polymerization.

We have discovered that open pad residue can be eliminated or at least reduced in the otherwise conventional etch process by raising the wafer temperature, whether by increasing the cathode temperature or by reducing the pressure of the helium thermal transfer gas, or by increasing the wafer bias. However, these steps as well affect the etching of the via hole. Accordingly, it is proposed to precede the main oxide etch with a plasma flash step using a leaner chemistry than $C_4F_6$ or other low F/C-ratio perfluorocarbon and to continue the RF power in the transition between the flash step and the main etch. Thereby, the wafer temperature is raised by the plasma processing of the flash step and continues to remain warm while the rich $C_4F_6$ chemistry is introduced into the chamber.

We believe that the observed open pad residue forms in a conventional depowered transition from flash to main etch because the $C_4F_6$ deposits a polymer in the open pad area while the wafer is cooler than it is thereafter when the main etch plasma has been excited and is allowed sufficient time to warm the wafer for the principal portion of the main etch. The cooler polymer may be deposited either during the initial portion of the $C_4F_6$ plasma or even from the non-plasma $C_4F_6$ during the stabilization step. In contrast, when the plasma is not powered down during the transition, the wafer maintains a higher temperature during the transition and in the initial portion of the main etch.

Figure 5:
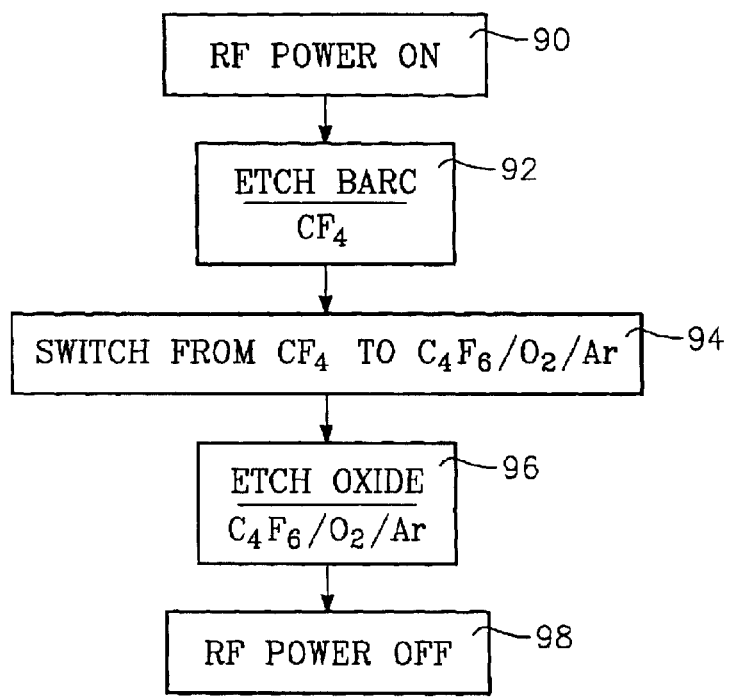
FIG. 5 is a flow diagram of an oxide etching process of an embodiment of the invention.

If there is a BARC layer or other anti-reflective coating, the flash step of the invention may be the step used to remove it. As illustrated in the flow diagram of FIG. 5, after a photomasked wafer with a BARC layer overlying an oxide layer is placed in the plasma etch reactor, the plasma is excited by turning on the RF power in step 90. In step 92, the BARC layer is etched by a plasma of $CF_4$, for example, at a pressure of 40 milliTorr, a power of 1000W applied to the pedestal electrode for a 200 mm wafer, a cathode temperature of 0° C., and a helium pressure of 8 milliTorr. No magnetic field is typically applied during the flash step. A 10 s flash etch is usually sufficient to etch through the BARC layer.

After the BARC layer has been opened, a transition step 94 is performed in which the supply of the $CF_4$ etching is cut off and immediately substituted by the supply of the $C_4F_6$/$O_2$/Ar etching gas without extinguishing the plasma. The transition step 94 is followed by a main etch step 96 of sufficient duration to etch through the inter-level dielectric. The main etch 96 may continue for a minute or more. The duration of the transition 94 can be very short and is dictated by the differences between the BARC open 92 and the main etch 96.

A sample main etch recipe includes an RF power of 1600W for a 200 mm wafer, a chamber pressure of 40 milliTorr, a cathode temperature of 0° C., a helium pressure of 10 milliTorr, and a magnetic field of 30 gauss. Typically, there is approximately at least as much oxygen as hexafluorobutadiene, and the amount of argon exceeds that of $C_4F_6$ by a factor of at least 15 or 20. For such a recipe the transition 94 can be very short, for example, less than 1 s. On the other hand, if there is a significant change in pressure, a 2 to 3 s transition 94 may be required to equilibrate to the new pressure. A significant pressure change is considered to be one in which the pressure in the main etch step differs from that in the flash step by more than 20% of the flash pressure. Similarly, a significant change in power may require some time to ramp up or down. Only after the completion of the main etch 94 is the RF power turned off in step 98 and the plasma extinguished. However, there may be additional plasma processing steps either before or after the RF power is turned off, such as removing an etch stop layer at the bottom of the etched hole or stripping photoresist and etch residue.

Another type of transition occurs between a lower-power BARC open using $CF_4$ and a higher-power main etch using $C_4F_6$ and $O_2$. In the transition step, the bias power is increased to the level used in the main etch and the magnetic field may be turned on. However, the ratio of $C_4F_6$ to $O_2$ is less in the transition than in the main etch, for example, 1:1 rather than 5:3. This minimum 50% reduction in the $C_4F_6$-to-$O_2$ ratio prevents excessive polymerization in the warm-up transition period, but maintaining a ratio of greater than 0.5 preserves photoresist selectivity.

Such a power-on transition has been observed to eliminate observable residue in the open pad and to prevent etch stop there. The power-on transition has not demonstrated any significant effect on the main etch and its selectivities.

The transition step need be no longer than 10 s, and a 5 s transition has been observed to effectively eliminate residue on the pads.

If there is no anti-reflection layer needing to be removed, conventionally no flash step has been performed. However, in order to reduce open pad residue in a rich oxide etch, it is recommended that a lean flash step be performed even in the absence of the anti-reflection layer with a power-on transition to the main etch. A lean flash chemistry of $CF_4$ and optionally $O_2$, with or without Ar, may be used. In the absence of an anti-reflection layer to be removed, a fluorocarbon is not needed for the flash. In this case, pure argon (Ar) can be supplied during the flash step. A pure argon flash using 400W of RF power followed by a power-on transition has been shown to be effective in preventing open pad residue. A larger amount of power may be used in the flash step so that the flash temperature more closely equals the main etch temperature.

The processing gas of the flash step is not limited to $CF_4$ and Ar. It should be leaner than the main etchant perfluorocarbon, for example, $C_4F_6$. For a perfluorocarbon used in the ARC open, its C/F ratio should be less than that of the perfluorocarbon used in the main etch, that is, a C/F greater than 1.5 when $C_4F_6$ is the main etchant and preferably 2 or more. Although many such perfluorocarbons have been used for their polymerizing qualities, the chemistry of the main etch step for $C_4F_6$ is optimized to deposit some but not too much polymer. A leaner chemistry with generally the same conditions will be less polymerizing and unlikely to form a residue on the open pad. The following etching gas mixtures have also been shown to be effective at preventing open pad residues: $C_4F_8/O_2$, $C_4F_8/C_2F_6$, and $CH_3F/CF_4$. Therefore, there is a broad class of fluorocarbons available for the flash step which can be optimized for opening the ARC layer. Argon is typically added to the fluorocarbon in the flash step although it is not required.

The invention is also applicable to other fluorocarbon etchants, particularly perfluorocarbons, having a low-F/C for example, no more than 1.6, the value for $C_5F_8$.

Figure 1:
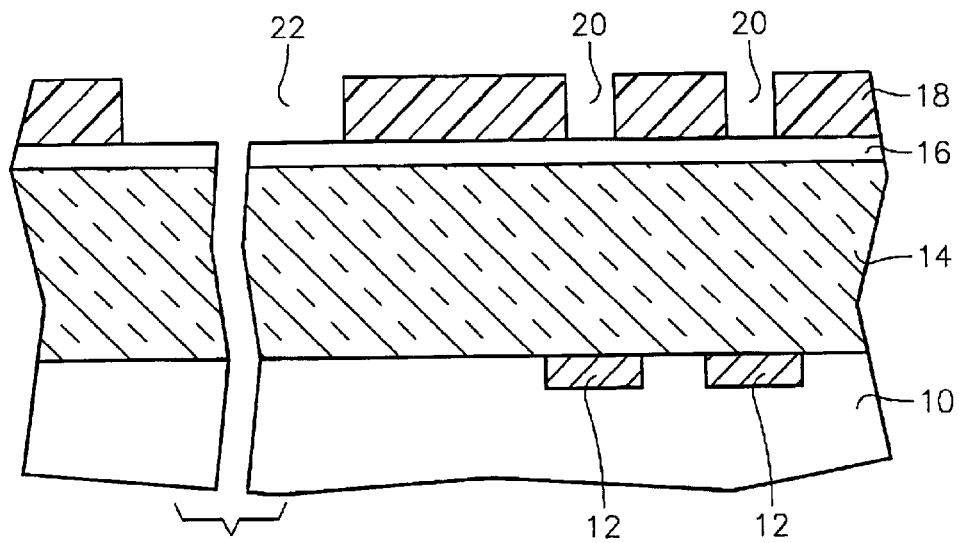
FIG. 1 is a cross-sectional view of a dielectric level in an integrated circuit prior to etching.
Figure 2:
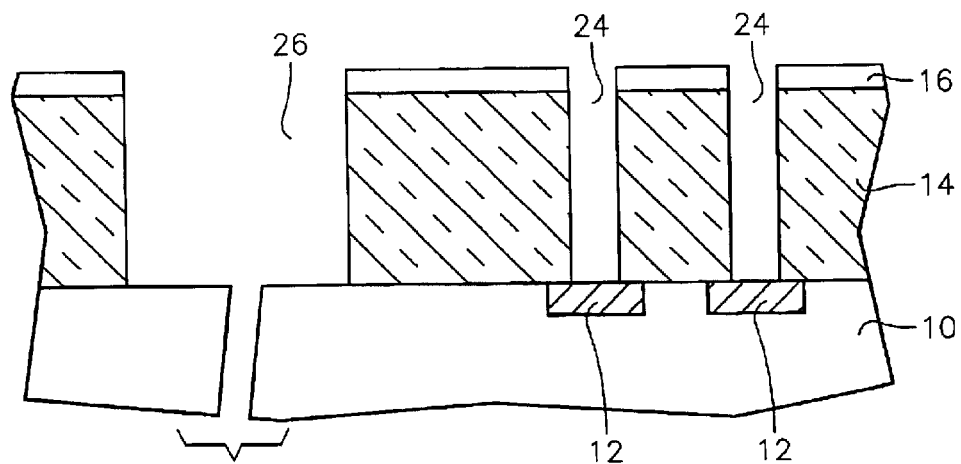
FIG. 2 is a cross-sectional view of the dielectric level of FIG. 1 after etching.
Figure 3:
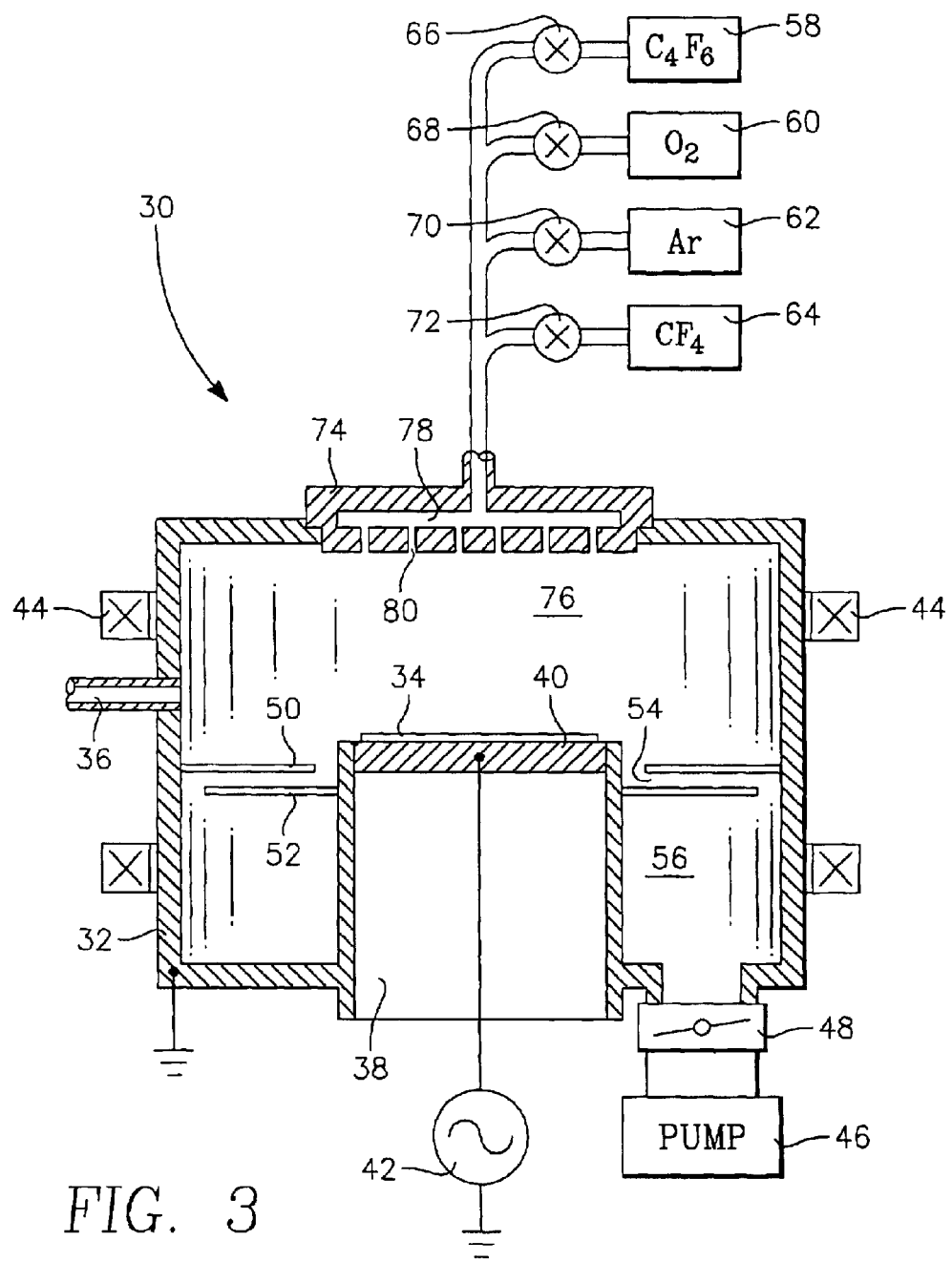
FIG. 3 is a schematic view of a magnetically enhanced plasma reactor.
Figure 4:
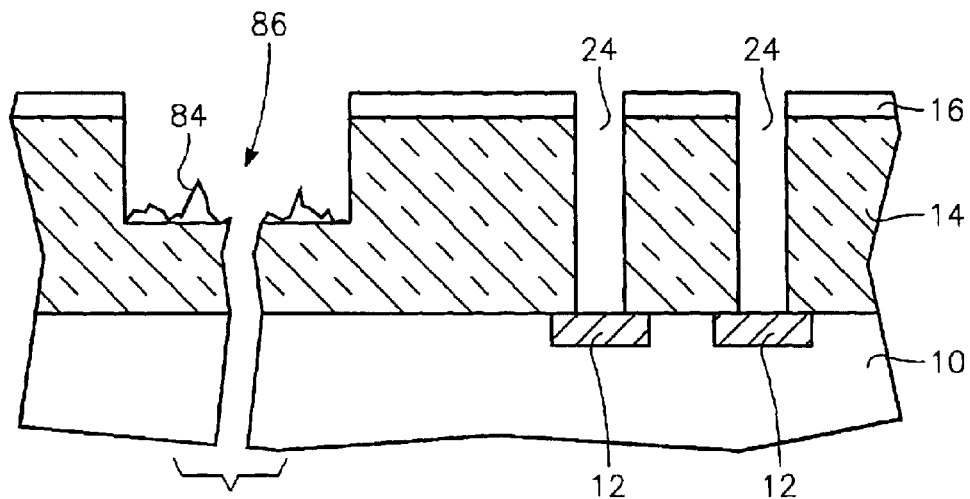
FIG. 4 is a cross-sectional view of the dielectric level of FIG. 1 after etching in which the open pad did not completely etch.

The invention may be practiced in other etch reactors. Different means may be used to supply the etching gas and to generate the magnetic field. The plasma reactor may be of different type, such as an inductively coupled reactor or an ECR reactor, both of which separate the pedestal biasing from the plasma source generation. However, the invention is particularly applicable to a capacitively coupled reactor, such as the MERIE reactor of FIG. 3, in which there are a limited number of tools to control the formation of residue while still achieving a fast, selective, anisotropic etch. An advantage of the MERIE reactor of FIG. 3 is that the magnetic field can be turned on during only some of the steps, for example, during the main etch. More generally, the strength of the magnetic field may increased in the main etch step relative to the strength during the flash step. However, the invention may also be practiced in a MERIE reactor using permanent magnets of fixed magnetic strength.

Although the invention has been demonstrated in preventing residue from forming in the open pad, the use of the process of the invention is not limited to such structures.

The invention thus reliably provides an open pad area free of residue and useful for monitoring with only a minor change in processing conditions.

What is claimed is:

1. A dielectric etching method, comprising the steps of:
   placing into a plasma etch reactor a substrate having a patterned mask having a plurality of first apertures having a first minimum size of no more than 0.25 μm and at least one second aperture having a minimum size of at least fifty times greater than said first minimum size;
   processing said substrate in a plasma of a first gas;
   without extinguishing said plasma, then etching a dielectric layer in said substrate in a plasma of a second gas comprising a first perfluorocarbon having an F/C ratio of no more than 1.6, wherein said first gas is less polymerizing than said second gas by an amount sufficient to prevent residue from forming in said at least one second aperture.

2. The method of claim 1, wherein said mask comprises photoresist.

3. The method of claim 1, wherein said first perfluorocarbon comprises $C_4F_6$.

4. The method of claim 1, wherein said first gas comprises a second perfluorocarbon having an F/C ratio of at least 2.0.

5. The method of claim 1, wherein said dielectric layer is overlaid by an anti-reflection coating and wherein said processing step etches through said anti-reflection coating with said plasma of said first gas.

6. The method of claim 1, further comprising maintaining an interior of said plasma etch reactor at a first pressure during both said processing and etching steps.

7. The method of claim 1, wherein said reactor is a magnetically enhanced, capacitively coupled reactor.

8. The method of claim 1, wherein said first gas consists essentially of Ar.

9. The method of claim 8, wherein said dielectric layer directly underlies said mask.

10. The method of claim 1, wherein said second gas additionally comprises $O_2$ and Ar.

11. The method of claim 10, wherein said first gas comprises $C_4F_6$ and $O_2$, wherein a ratio of the amounts of $C_4F_6$ and $O_2$ in said first gas step is less than that in said second gas.

12. A dielectric etching method, comprising the steps of:
    placing into a plasma etch reactor a substrate having a patterned mask;
    processing said substrate in a plasma of a first gas consisting essentially of a first perfluorocarbon having an F/C ratio of at least 2.0;
    without extinguishing said plasma, then etching a dielectric layer in said substrate in a plasma of a second gas comprising a second perfluorocarbon having an F/C ratio of no more than 1.6.

13. The method of claim 12, wherein said first perfluorocarbon is $CF_4$.

14. The process of claim 12, wherein said first gas is less polymerizing than said second gas.

15. A dielectric etch process for etching a via or contact hole through an inter-level dielectric layer formed in a substrate and overlaid by an anti-reflection coating a patterned mask overlying said anti-reflection coating, said process comprising to steps of:
    placing said substrate in a plasma reactor;
    a first step of flowing a first etching gas into said reactor and exciting it into a plasma to etch through said anti-reflection coating; and
    a second step of flowing into said reactor a second etching gas comprising a perfluorocarbon having a F/C ratio of no more than 1.6 to etch said dielectric layer, said plasma not being extinguished between said first and second steps, said first etching gas being less polymerizing than said second etching gas.

16. The process of claim 15, wherein said perfluorocarbon comprises $C_4F_6$.

17. The process of claim 15, wherein said perfluorocarbon comprises $C_4F_6$.

18. The process of claim 15, wherein said first etching gas consists essentially of $CF_4$.

19. The process of claim 15, wherein an interior of said chamber is maintained at a pressure varying by no more than 20% between said first and second steps.

20. The process of claim 15, wherein said reactor is a magnetically enhanced, capacitively coupled reactor.

21. The process of claim 15, wherein said reactor has a variable magnetic field and wherein said magnetic field is increased during the second step relative to said first step.

22. The process of claim 15, wherein said first etching gas comprises $O_2$ and Ar.

23. The process of claim 22, wherein said first etching gas comprises $CF_4$.

24. The process of claim 15, wherein said second etching gas comprises $C_4F_6$, $O_2$, and Ar.

25. The process of claim 24, wherein said first etching gas comprises $CF_4$.

26. The process of claim 15, wherein said mask contains first apertures for a plurality of said vias or contacts and at least one second aperture having a minimum size at least 50 times larger than a minimum size of said first apertures.

27. The process of claim 26, wherein said first etching gas is less polymerizing than said second etching gas by an amount sufficient to prevent residue from in said at least one second aperture.

28. A dielectric etching method for etching holes into an upper dielectric layer overlying a lower dielectric layer of a substrate having a plurality of conductive features formed in an upper surface of said lower dielectric layer, said method comprising the steps of:

placing into a plasma etch reactor said substrate having a mask formed on a surface thereof patterned with a plurality of first apertures overlying respective ones said conductive features and at least one second aperture not overlying any of said conductive features;

processing said substrate in a plasma of a first gas; and without extinguishing said plasma, then etching said upper dielectric layer in a plasma of a second gas comprising a first perfluorocarbon having an F/C ratio of no more than 1.6, wherein said first gas is less polymerizing than said second gas.

29. The method of claim 28, wherein said etching step exposes said respective conductive features.

30. The method of claim 28, wherein said first perfluorocarbon comprises $C_4F_6$.

31. The method of claim 30, wherein said first gas comprises a second perfluorocarbon having an F/C ratio of at least 2.

32. The method of claim 31, wherein said second perfluorocarbon is $CF_4$.

33. The method of claim 28, wherein said apertures have a first minimum size of no more than 0.25 $\mu$m and said at least one second aperture has a minimum size of at least fifty times greater than said first minimum size.

34. The method of claim 33, wherein said first gas is less polymerizing than said second gas by an amount sufficient to prevent residue from forming in said at least one second aperture.

* * * * *